(12) United States Patent
Cheng

(10) Patent No.: US 7,873,803 B2
(45) Date of Patent: Jan. 18, 2011

(54) NONVOLATILE MEMORY WITH SELF RECOVERY

(75) Inventor: Steven S. Cheng, Sunnyvale, CA (US)

(73) Assignee: SanDisk Corporation, Milpitas, CA (US)

( * ) Notice: Subject to any disclaimer, the term of this patent is extended or adjusted under 35 U.S.C. 154(b) by 501 days.

(21) Appl. No.: 11/861,146

(22) Filed: Sep. 25, 2007

(65) Prior Publication Data

US 2009/0083485 A1 Mar. 26, 2009

(51) Int. Cl.
*G06F 12/00* (2006.01)
(52) U.S. Cl. .................. 711/161; 711/103; 711/162; 711/E12.103; 714/6
(58) Field of Classification Search .................. None
See application file for complete search history.

(56) References Cited

U.S. PATENT DOCUMENTS

| | | | | |
|---|---|---|---|---|
| 4,092,732 A | 5/1978 | Ouchi | .................. | 364/900 |
| 4,761,785 A | 8/1988 | Clark et al. | .................. | 371/51 |
| 4,870,643 A | 9/1989 | Bultman et al. | .................. | 371/11.1 |
| 5,650,969 A | 7/1997 | Niijima et al. | .................. | 365/200 |
| 5,680,579 A | 10/1997 | Young et al. | .................. | 395/484 |
| 6,404,647 B1 | 6/2002 | Minne' | .................. | 361/760 |
| 6,871,295 B2 | 3/2005 | Ulrich et al. | .................. | 714/6 |
| 6,941,412 B2 | 9/2005 | Gongwer et al. | .................. | 711/103 |
| 7,093,157 B2 | 8/2006 | Hajji | .................. | 714/5 |
| 2003/0115514 A1 | 6/2003 | Ilkbahar et al. | .................. | 714/52 |
| 2004/0205352 A1* | 10/2004 | Ohyama | .................. | 713/194 |
| 2006/0143505 A1 | 6/2006 | Olarig et al. | .................. | 714/6 |
| 2007/0150790 A1 | 6/2007 | Gross et al. | .................. | 714/763 |

FOREIGN PATENT DOCUMENTS

| | | |
|---|---|---|
| DE | 3619174 | 6/1987 |
| EP | 0709782 | 5/1996 |
| EP | 1246066 | 10/2002 |
| EP | 1246066 A2 * | 10/2002 |
| EP | 1703400 | 9/2006 |
| EP | 1703400 A2 * | 9/2006 |

OTHER PUBLICATIONS

International Search Report and Written Opinion mailed Feb. 12, 2009 in Application No.: PCT/US2008/077267. 11 pages. [P612WO].

* cited by examiner

*Primary Examiner*—Shawn X Gu
(74) *Attorney, Agent, or Firm*—Weaver Austin Villeneuve & Sampson LLP

(57) ABSTRACT

A nonvolatile memory array includes two or more devices, each device containing data that is scrambled using a different scrambling scheme. When the same data is provided and stored in both devices, different data patterns occur in each device, so that if one of the patterns causes data pattern induced errors, the original data can be recreated from another copy that does not share the same data pattern.

14 Claims, 14 Drawing Sheets

*Normal Operation*

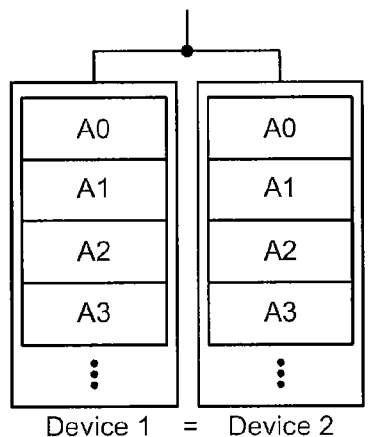
Device 1 = Device 2
*Normal Operation*
FIG. 1
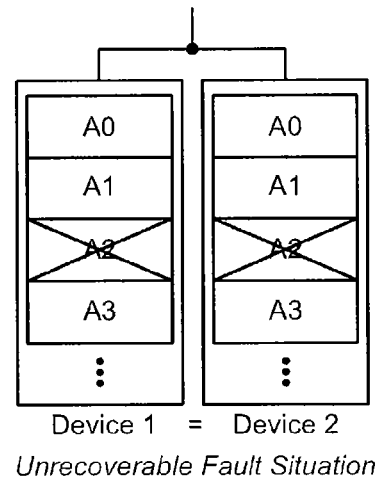
Device 1 = Device 2
*Unrecoverable Fault Situation*
FIG. 2
FIG. 3
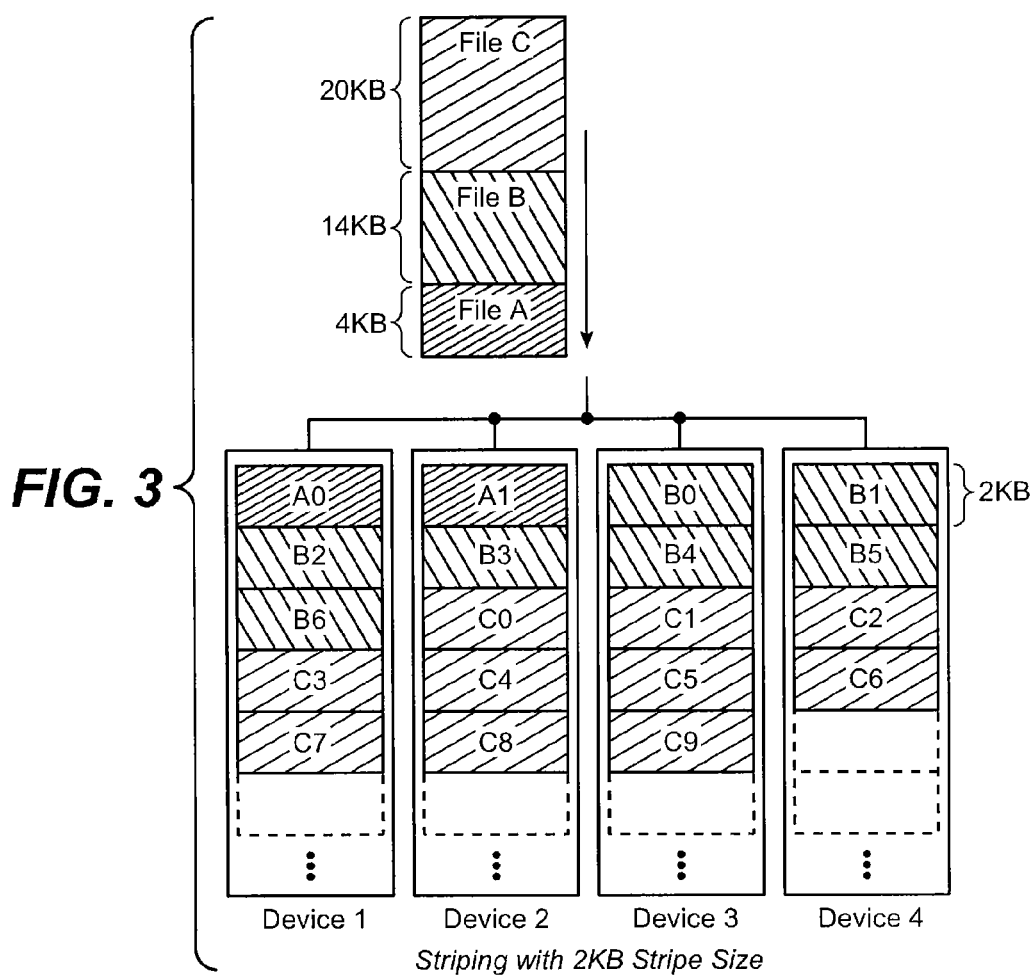
*Striping with 2KB Stripe Size*

Striping with 4KB Stripe Size

Normal Operation

Unrecoverable Fault Situation

Normal Operation

Unrecoverable Fault Situation

Normal Operation

Unrecoverable Fault Situation

Normal Operation

Recoverable Fault Situation

*Normal Operation*

*Recoverable Fault Situation*

Normal Operation

Recoverable Fault Situation

*After Fault Recovery*

NONVOLATILE MEMORY WITH SELF RECOVERY

BACKGROUND OF THE INVENTION

This invention relates to nonvolatile memories and methods of forming nonvolatile memories. In particular, this application relates to nonvolatile memory arrays in which floating gate memory cells individually hold one or more bits of data.

Nonvolatile memory systems are used in various applications. Some nonvolatile memory systems are embedded in a larger system such as a personal computer. Other nonvolatile memory systems are removably connected to a host system and may be interchanged between different host systems. Examples of such removable memory systems include memory cards and USB flash drives. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and microSD/TransFlash™ memory module standards. There are several USB flash drive products commercially available from SanDisk Corporation under its trademark "Cruzer®." USB flash drives are typically larger and shaped differently than the memory cards described above. Solid State Drives (SSDs) use nonvolatile memory systems in applications where Hard Disk Drives (HDDs) have traditionally been used, such as in laptop computers.

Different types of memory array architecture are used in nonvolatile memory systems. Flash memory arrays that use floating gates to store charge are one common type of memory array. In one type of architecture, a NAND array, a series of strings of more than two memory cells, such as 16 or 32, are connected along with one or more select transistors between individual bit lines and a reference potential to form columns of cells. Word lines extend across cells within a large number of these columns. An individual memory cell may hold one bit of data in what is known as a Single Level Cell (SLC) design. In some examples, a memory cell may hold two or more bits of data in what is known as a Multi Level Cell (MLC) design.

Reliability is generally an important feature in memory products, and is especially important for certain industrial applications. Thus, there is a need for nonvolatile memory systems with high reliability.

SUMMARY OF THE INVENTION

A combination of Redundant Array of Independent Disk (RAID) techniques and data scrambling can provide high reliability in nonvolatile memory arrays. In particular, where different data scrambling is used in different devices that provide redundancy, each device contains a different data pattern, even though the original (unscrambled) data is the same for each device. Thus, any errors induced by a particular data pattern in a device is not repeated in multiple devices because of the different scrambling used. A RAID system using such scrambling incorporates protection against data pattern induced errors as well as device failure.

A method of securely storing data in a nonvolatile memory array according to an embodiment of the present invention comprises: transforming a portion of data according to a first transformation to obtain first transformed data; storing the first transformed data in a first portion of the memory array; transforming the portion of data according to a second transformation to obtain second transformed data; and storing the second transformed data in a second portion of the memory array while the first transformed data is stored in the first portion of the memory array, to provide redundant storage of the portion of data.

A nonvolatile memory system according to an embodiment of the present invention comprises: a first portion of a memory array; a first data scrambler unit connected to the first portion of the memory array to scramble data according to a first transformation prior to storage in the first portion of the memory array; a second portion of the memory array; and a second data scrambler unit connected to the second portion of the memory array to scramble data according to a second transformation prior to storage in the second portion of the memory array, the second data scrambler unit connected in parallel with the first data scrambler unit.

BRIEF DESCRIPTION OF THE DRAWINGS

FIG. 1 shows a memory system using mirroring, where all data stored in a first device is also stored in a second device.

FIG. 2 shows the memory system of FIG. 1 where data A2, because of its pattern when stored, is uncorrectable by ECC when it is read. Both copies of data A2, in device 1 and device 2, are uncorrectable.

FIG. 3 shows data being stored using striping to distribute the data across four devices.

DETAILED DESCRIPTION OF ILLUSTRATED EMBODIMENTS

Figure 4:
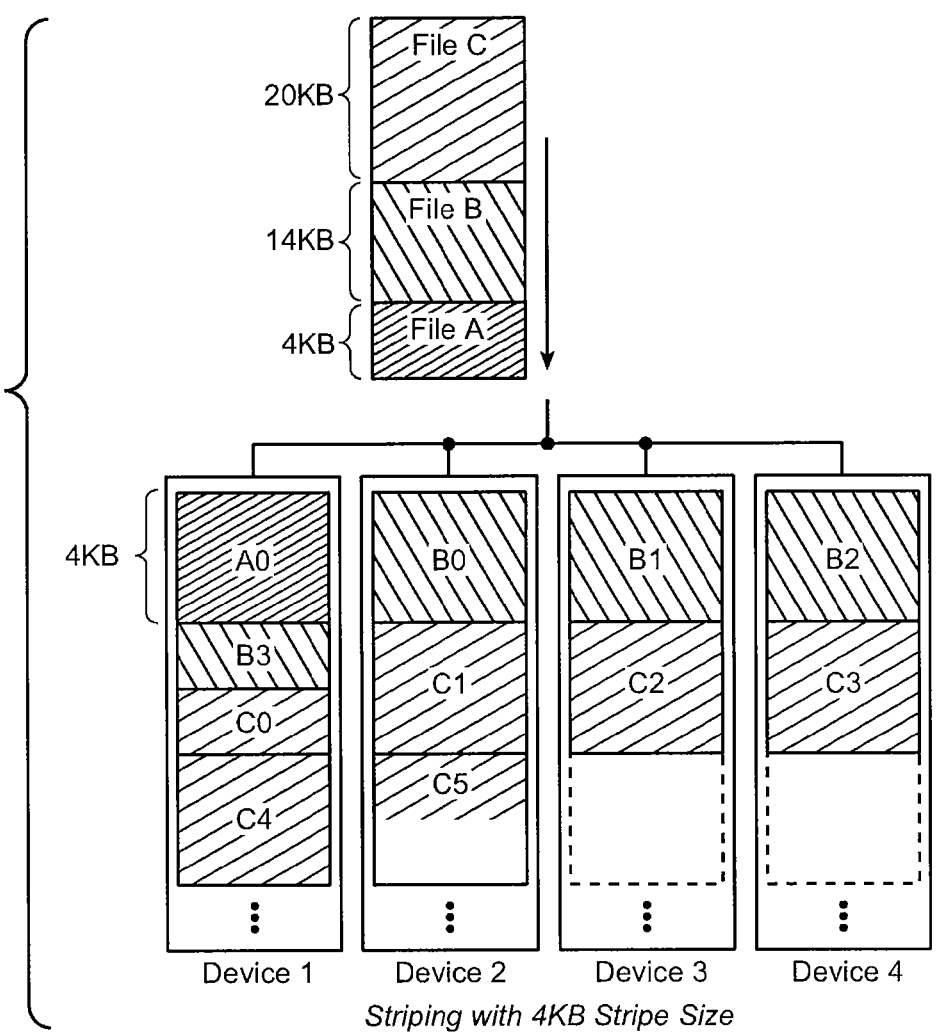
FIG. 4 shows an alternative striping arrangement with larger stripes.

Various methods are used to achieve high reliability data storage in nonvolatile memory systems. Certain methods that improve reliability through redundancy use a Redundant Array of Independent Disks (RAID). There are different types of RAID systems that use mirroring, striping, and parity data, or some combination of these techniques. Although the term RAID is generally associated with Hard Disk Drives (HDDs), RAID techniques may be used with other types of memory including nonvolatile memory arrays such as flash memory.

FIG. 1 shows two devices, device 1 and device 2, which are connected in a mirroring arrangement (also referred to as RAID 1). Mirroring means that the same data that is stored in device 1, A0, A1, A2, A3, is also stored in device 2 so that there is a redundant copy of each unit of data in device 2. In other examples, more than two devices may be connected in this way to provide more than two copies of the same data. Generally, maintaining a separate copy of the same data in two or more devices provides protection against failure of any individual device. Thus, if device 1 fails in FIG. 1, all the data stored in device 1 can be recovered from device 2 instead.

While a redundant copy of data in a separate device protects against device failure, it does not protect against all possible forms of data loss. In particular, in certain nonvolatile memory arrays, particular patterns of data storage may increase the chances of data becoming corrupted. This may occur because of the interaction between adjacent cells, with floating gates of cells affecting not only their underlying channels, but also affecting neighboring channels and thus affecting threshold voltages of neighboring cells. This is especially a problem for MLC memory systems in which small changes in a cell's threshold voltage may result in one or more bits stored in the cell being incorrectly read. The problem tends to become more severe as dimensions in memory arrays become smaller and interactions between cells become stronger. For example, an MLC cell that is initially programmed to a low threshold voltage (little or no charge on its floating gate) may later have its threshold voltage raised because neighboring cells are programmed to high threshold voltages (large charges on their floating gates). This may be considered a form of program disturb. Which specific data patterns cause program disturb, and the degree of disturb caused (the number of bits that are later erroneously read) depends on the memory architecture. Thus, there may be particular patterns of data that will cause data stored in particular memory arrays to be read erroneously even though the memory array is working within its design limits. Avoiding such data patterns is generally desirable.

Many memory systems include some form of Error Correction Coding (ECC) in order to allow data containing some erroneous bits to be detected and corrected. In order to do this, the data is stored with some redundancy. When the data is read, the redundancy allows the data to be checked for errors, and up to some limited number of errors may be corrected. However, in order to correct a large number of errors, a high degree of redundancy is needed (a large number of extra bits) which is not an efficient use of memory space. Typically, the degree of redundancy used is based on expected error rates (e.g. based on a number of expected defective cells) and may not be sufficient to correct a high number of errors, such as caused by a particular data pattern. In particular, data pattern induced errors may occur together in the same portion of data in cells that are exposed to similar conditions, and ECC is generally limited to correcting only a limited number of bits in such a portion of data. Thus, ECC alone may not be sufficient to overcome data pattern induced errors in certain memory systems.

FIG. 2 shows an example where device 1 and device 2 store identical copies of the same data. In this case, a portion of data A2 has a data pattern such that when A2 is stored and later read, the data that is read has a high number of errors because of interaction between cells. This may include interaction of cells within A2 and interaction with cells outside A2. In particular, cells in a row tend to be affected by cells in adjacent rows of the same block. In this case, the number of errors in data A2 is beyond the correcting capability of the ECC scheme being used and the data is considered to be uncorrectable by ECC. Data portion A2 may be any unit of data, such as a sector of 512 bytes (plus overhead), a page (unit of writing) or a block (minimum unit of erase). Data A2 is stored identically in both device 1 and device 2, so the same pattern occurs in each device. Therefore, copies of data A2 in both devices are affected and neither copy is recoverable. Thus, in this case, mirroring alone does not provide a sufficient level of reliability to enable all data to be recovered.

FIG. 3 shows a first example of data striping between different devices (RAID 0). Data is received as three files, File A, File B and File C as shown. These files are then spread out across devices 1-4 as shown. In particular, File A is stored as A0 in device 1 and A1 in device 2. File B is stored as B0-B6, which are spread out across devices 1-4. And File C is stored as C0-C9, which are spread out across devices 1-4. A stripe of data in this example consists of one unit of data in each device, e.g. A0, A1, B0 and B1 together make up a stripe. Each stripe contains 2 KBytes of data in this example. FIG. 4 shows another example in which the same data is striped across the same devices using a larger stripe size where each stripe contains 4 KBytes of data. Although striping does not provide any redundancy, it can improve reliability because data is broken up and data patterns that might otherwise induce errors may be avoided. Striping data may improve performance because it facilitates programming with a high degree of parallelism across multiple devices.

Figure 5A:
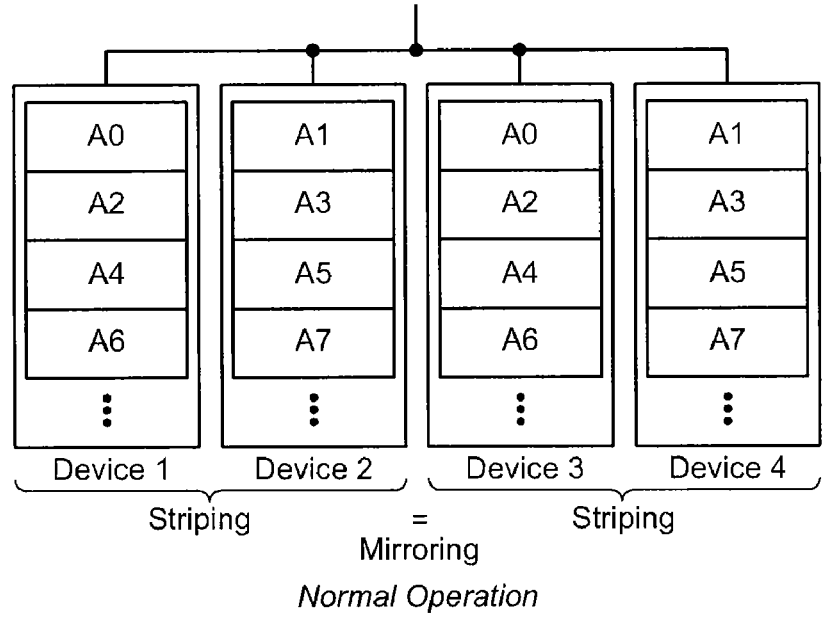
FIG. 5A shows a memory system using mirroring and striping of data.
Figure 5B:
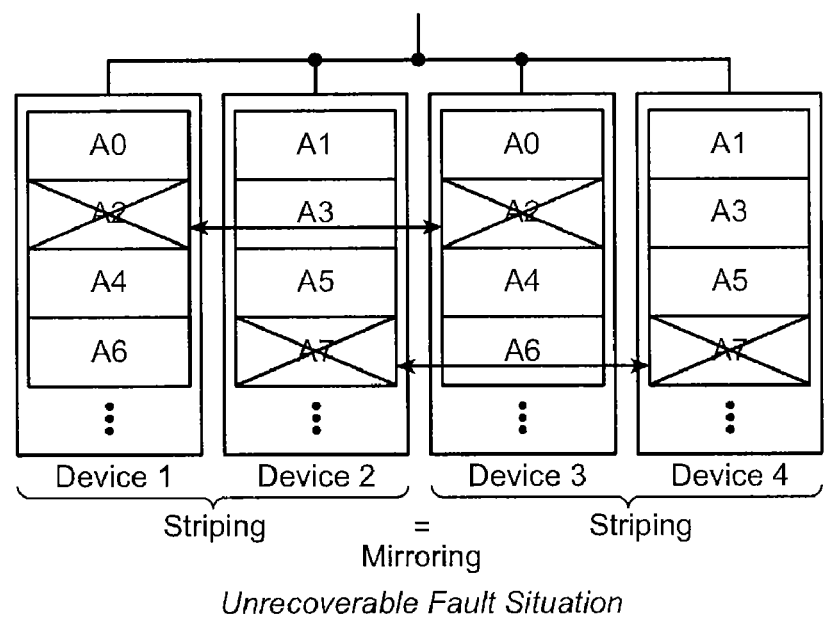
FIG. 5B shows the memory system of FIG. 5A with data A2 and A7 being uncorrectable by ECC when read because of data pattern induced errors.

FIG. 5A shows an example of a memory system using a combination of mirroring and striping. Data is striped between device 1 and device 2, and the data in devices 1 and 2 is mirrored in devices 3 and 4. This hybrid arrangement applying aspects of RAID 0 and RAID 1 may be referred to as RAID 0+1. As shown in FIG. 5B, this arrangement still suffers problems when certain patterns occur in the stored data. In particular, if storage of data A2 in device 1 causes an uncorrectable number of errors due to the data pattern, then the copy of data A2 stored in device 3 also contains an uncorrectable number of errors. Similarly, the two copies of data A7, in device 2 and device 4, are both uncorrectable, so there is no recoverable copy of either A2 or A7.

Figure 6A:
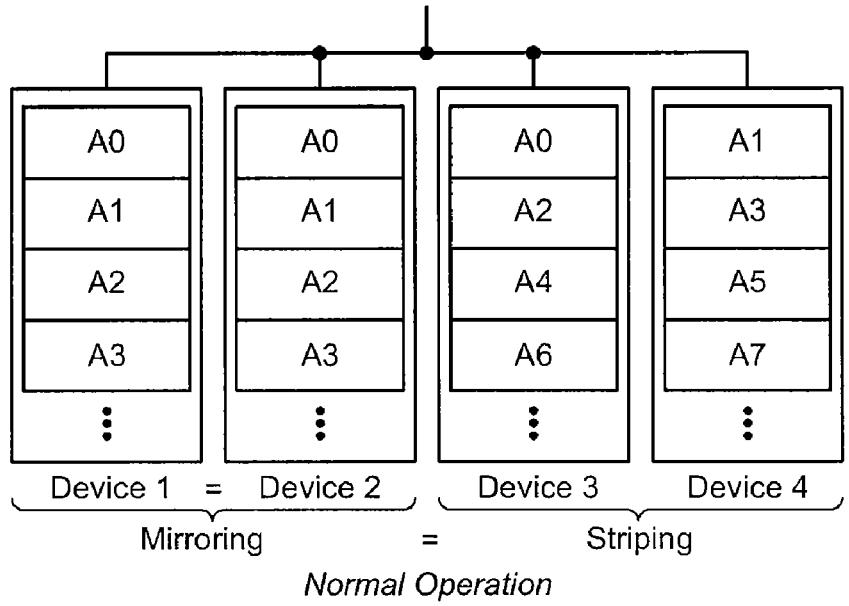
FIG. 6A shows an alternative memory system using mirroring and striping.
Figure 6B:
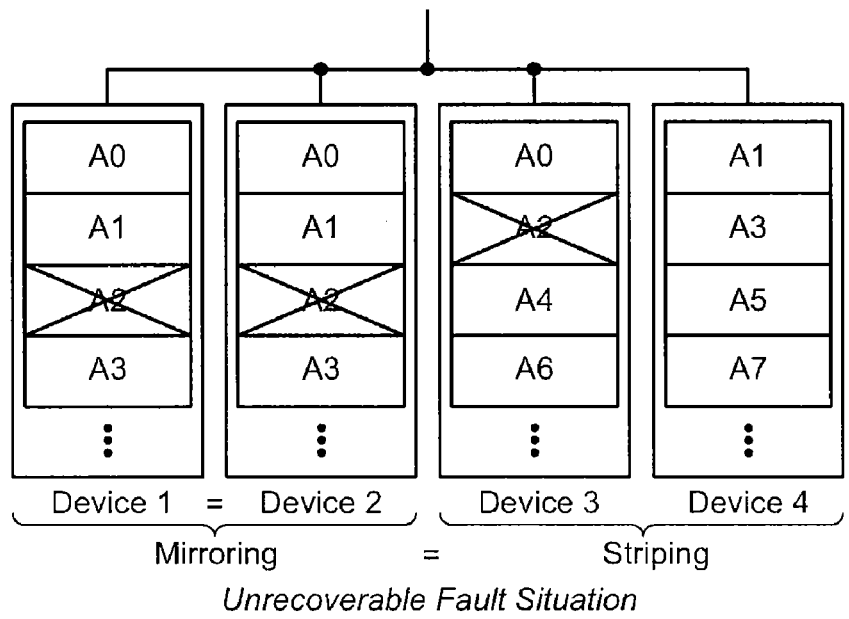
FIG. 6B shows the memory system of FIG. 6A, with data A2 being uncorrectable by ECC when read because of data pattern induced errors.

FIG. 6A shows an alternative combination of RAID 0 and RAID 1, which may be referred to as RAID 10. In this arrangement data in device 1 is mirrored in device 2. The same data that is stored in devices 1 and 2 is striped across device 3 and device 4. However, as shown in FIG. 6B, where one copy of data A2 is uncorrectable because of its data pattern, then the other copies of data A2 in other devices are also uncorrectable.

One approach to data patterns that may cause data to be uncorrectable when it is read is to scramble data before storage. Scrambling subjects data to some transformation so that the transformed data has a different pattern to untransformed data. In particular, such scrambling may introduce some randomization into a repeated pattern in the data. A simple example of a transformation is to invert (or flip) all bits, i.e. change all zeros to ones and change all ones to zeros. Other transformations involve performing exclusive OR (XOR) operations on data to be stored and some series of bits. Unlike ECC, scrambling does not add redundant bits, so the scrambled data includes the same number of bits as the original data. In some cases, a transformation may compress data, reducing the number of bits to be stored. Some transformations use data security algorithms that may break up data patterns.

Figure 7A:
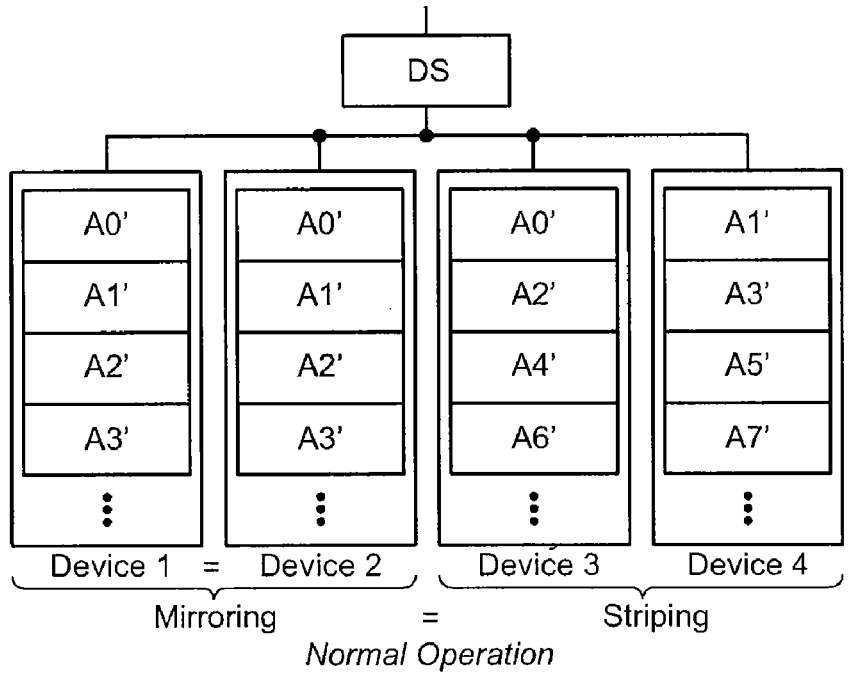
FIG. 7A shows a memory system using mirroring and striping that has a data scrambler unit to transform all data before the data is stored in the memory system.
Figure 7B:
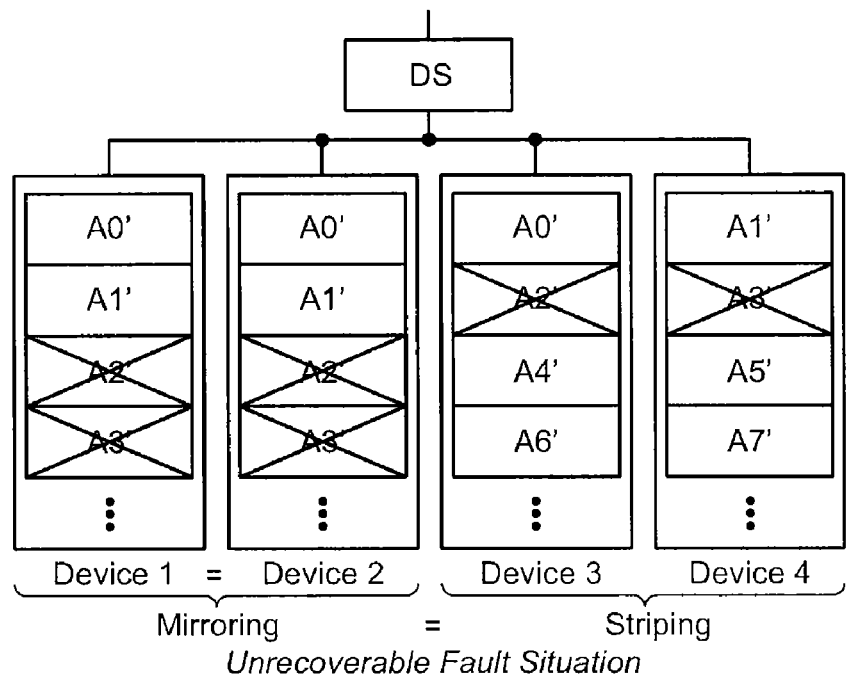
FIG. 7B shows the memory system of FIG. 7A with transformed data A2' and A3' being uncorrectable by ECC when read because of data pattern induced errors.

FIG. 7A shows an example where a data scrambler unit, or Data Scrambler (DS), is connected to devices 1-4 so that all data to be stored in devices 1-4 is scrambled before storage. Scrambling is indicated in FIG. 7A by an apostrophe so that A0 is transformed to become A0' etc. FIG. 7A shows a RAID 10 arrangement as in FIG. 6A, with data mirrored between device 1 and device 2, and the same data striped across device 3 and device 4. While scrambling data may result in transformed data that has a pattern that does not cause disturbs, in some cases the transformed data will have a pattern that causes errors when reading. In some cases, data that without scrambling would not cause errors is transformed into a pattern that does cause errors. FIG. 7B shows the result of scrambling where transformed data A2' and A3' have patterns that cause errors when read. Because these patterns cause errors, and the patterns are replicated in each copy of the data, no recoverable copy of the data is available. Thus, scrambling using a single data scrambler unit, in addition to mirroring and striping is not sufficient to ensure reliability in this case.

Figure 8A:
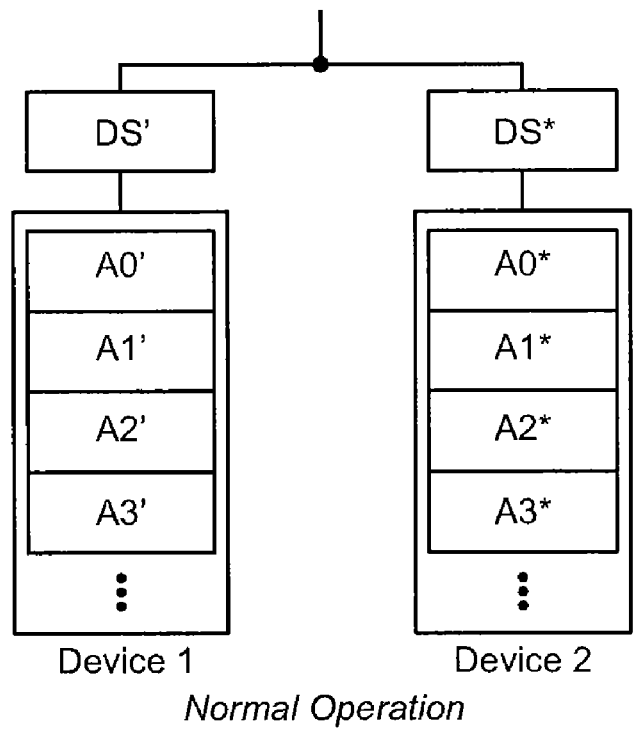
FIG. 8A shows an alternative memory system having a first data scrambler unit for device 1 and a second data scrambler unit for device 2 so that data in each device is subject to a different transformation.
Figure 8B:
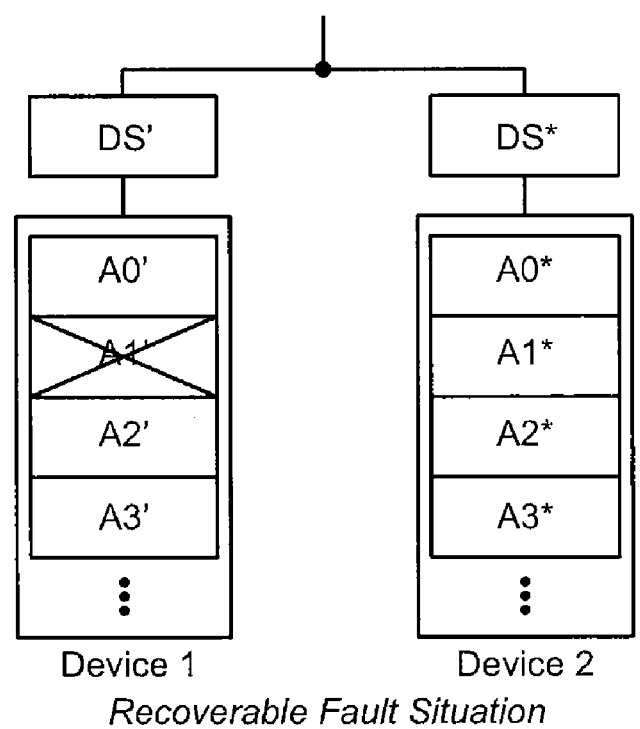
FIG. 8B shows transformed data A1' being uncorrectable by ECC when read because of data pattern induced errors, while transformed data A1* is still correctable.

FIG. 8A shows a data storage system according to an embodiment of the present invention. The memory system receives a sequence of units of data A0, A1, A2, A3 . . . which are transformed by the first data scrambler DS' according to a first transformation. The data transformed by DS' (A0', A1', A2', A3' . . . ) is stored in device 1. Data A0, A1, A2, A3 . . . are also transformed by a second data scrambler DS* (into A0*, A1*, A2*, A3* . . . ) and stored. Thus, data A0 is transformed into A0' for storage in device 1 and data A0 is transformed into A0* for storage in device 2. Data A0' has a different pattern to data A0*. Thus, the threshold voltages of cells of device 1 storing data A0' may not be the same as corresponding cells in device 2 that store data A0*. Similarly, for other portions of data, different copies undergo different transformations before storage so that the same data pattern is not reproduced. As discussed above, sometimes scrambled data may have a pattern that causes the stored data to be uncorrectable. FIG. 8B shows transformed data A1' being uncorrectable due to its data pattern when stored. However, transformed data A1* has a different data pattern when stored, so transformed data A1* is not uncorrectable. Thus, even though data A1' is not recoverable, a copy of original (untransformed) data A1 can be obtained from data A1*. Similarly, if any other unit of data was to be uncorrectable due to its data pattern when transformed and stored, the original data could still be recovered because the data was also subject to another transformation prior to storage in another device. Thus, the arrangement of FIG. 8B provides protection against device failure (i.e. if either device 1 or device 2 fails) and data pattern induced errors. While this method is similar to mirroring in that the data is stored in two independent devices, the two devices hold different data pattern as a result of scrambling. Thus, the data in device 2 does not mirror the data in device 1 and this is not true mirroring.

Figure 9A:
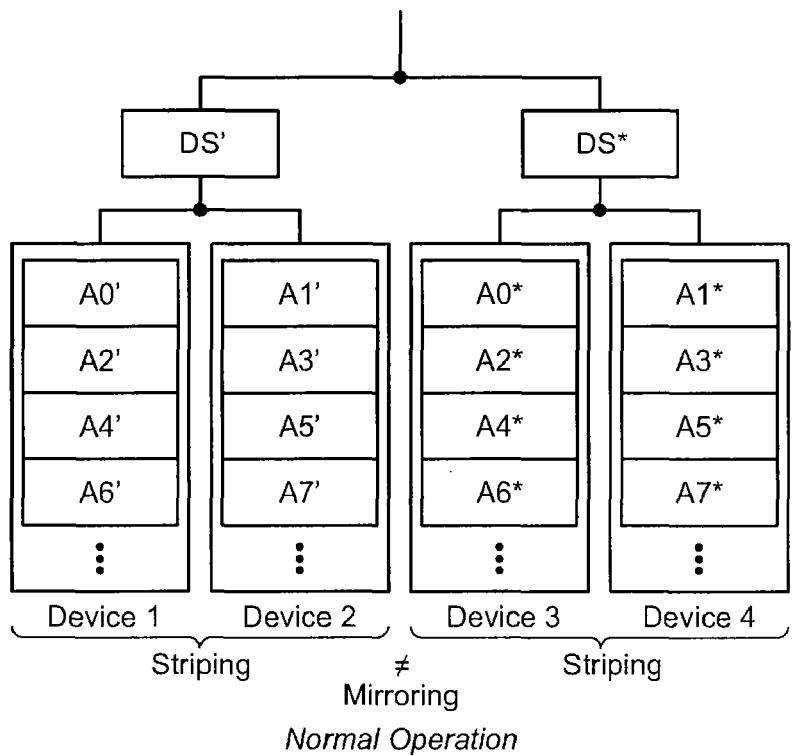
FIG. 9A shows an alternative arrangement with data striping between devices, where data is striped across devices that share a data scrambler.
Figure 9B:
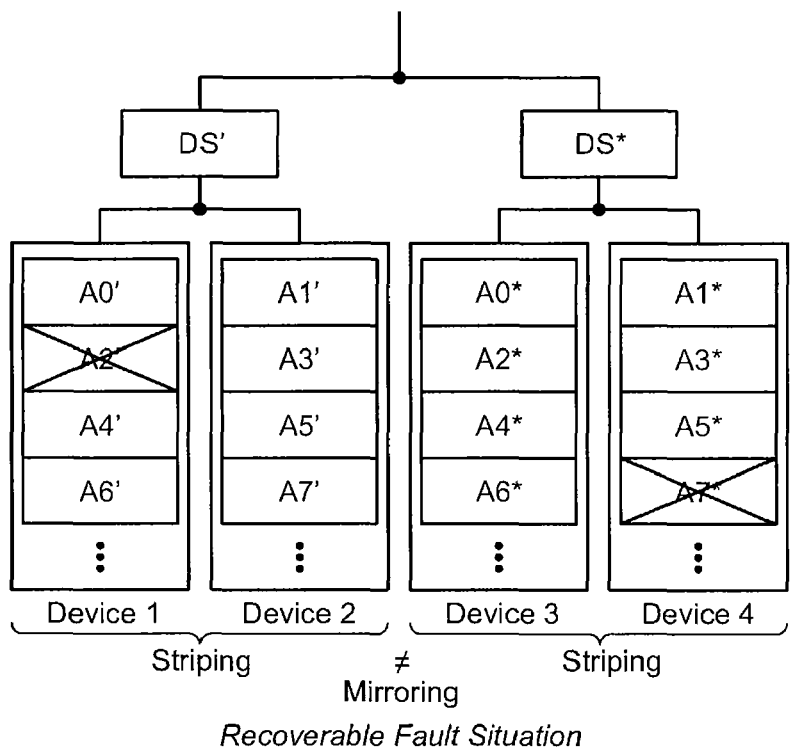
FIG. 9B shows the memory system of FIG. 9A with transformed data A2' and A7* being uncorrectable by ECC because of data pattern induced errors, while transformed data A2* and A7' remain correctable by ECC.

FIG. 9A shows another example using RAID 0+1 with two different scrambler units DS', DS* performing two different transformations of data. Data scrambler DS' serves device 1 and device 2, while data scrambler DS* serves device 3 and device 4. Thus, all data stored in device 1 and device 2 is subject to a first transformation, while the same data is subject to a second transformation before storage in device 3 and device 4. Data is striped between device 1 and device 2, and data is also striped between device 3 and device 4. In other examples, banks of more than two devices may share a data scrambler and have data striped in this manner. FIG. 9B shows data pattern induced errors occurring in transformed data A2' and in transformed data A7*. Original data A2 may be recovered by reading A2* and transforming it (reversing the transformation that created A2*). Because A2* has a different data pattern than A2' when stored, it is unlikely that both patterns induce errors. Similarly, even though A7* is unrecoverable, original data A7 can be recreated from A7'. The striping used in this example may allow a greater degree of parallelism during programming, which improves performance. While a different data scrambler unit may be provided for each device (i.e. separate data scrambler for devices 1, 2, 3, and 4), it is generally sufficient to provide one data scrambler for a group of devices that store striped data because such devices generally do not contain more than one copy of any particular portion of data.

Figure 10A:
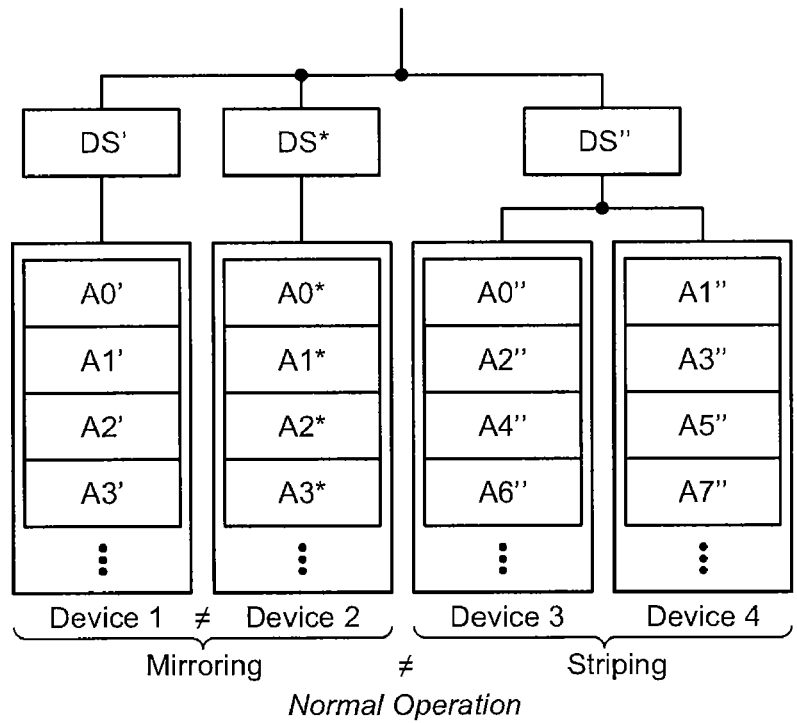
FIG. 10A shows another memory system where some devices have dedicated data scramblers and some devices share a data scrambler.
Figure 10B:
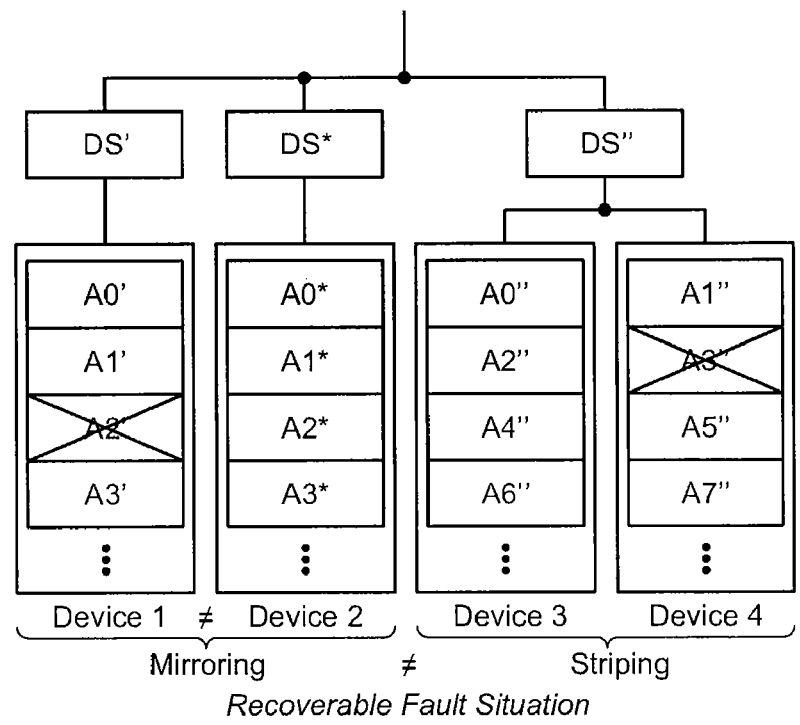
FIG. 10B shows the memory system of FIG. 10A with transformed data A2' and A3" being uncorrectable by ECC when read because of data pattern induced errors, while transformed data A2*, A2", A3' and A3* remain correctable by ECC when read.

FIG. 10A shows an alternative memory system that has a RAID 10 configuration. Data received by the memory system is subject to a first transformation by data scrambler DS' before it is stored in device 1. The received data is also subject to a second transformation by data scrambler DS* before being stored in device 2. The received data is also subject to a third transformation by data scrambler DS" before being stored in device 3 and device 4. The transformed data is striped across device 3 and device 4. Thus, in this example, if any transformation results in data that induces errors when the data is read, there are two other locations from which the data can be recovered. For example, FIG. 10B shows data A2' and data A3" being unrecoverable because of data pattern induced errors. However, for each of these units of data, there are two other versions (A2*, A2", A3' and A3*) from which the original data can be recovered.

Figure 10C:
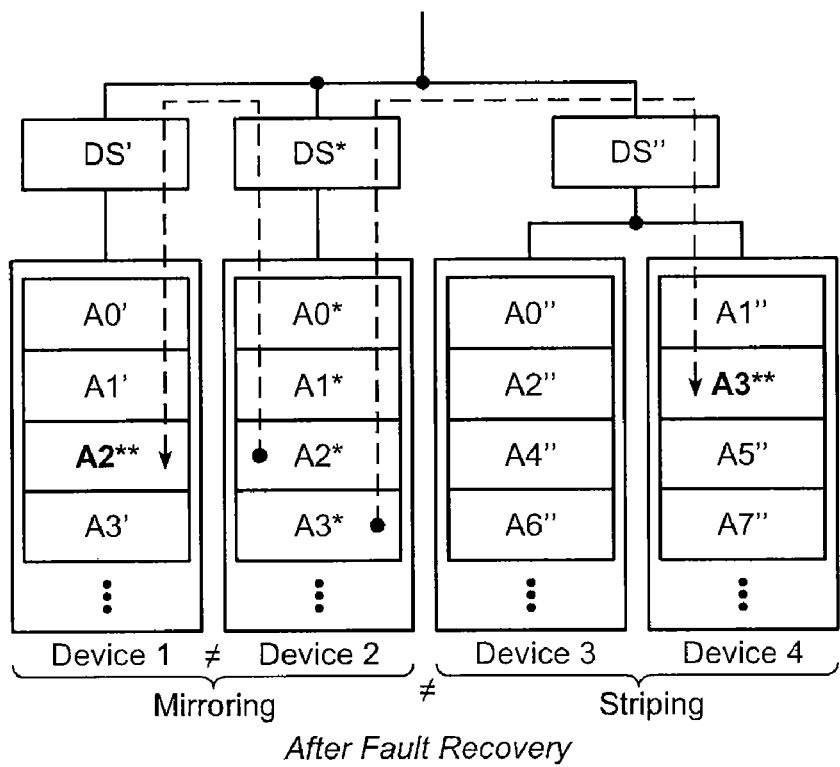
FIG. 10C shows replacement of uncorrectable transformed data A2' using data A2*, and replacement of uncorrectable transformed data A3" using data A3*.

FIG. 10C shows how portions of data A2' and A3" of FIG. 10B that are uncorrectable by ECC when read may be replaced by data generated from another device. For example, when A2' in device 1 is found to be uncorrectable by ECC, original data A2 is recovered from data A2* stored in device 2. The original data A2 may also be subject to yet another transformation to provide data A2**. This transformation may be performed by modifying the transformation performed by data scrambler DS' to be different to the earlier transformation. After this replacement, there are three devices from which original data A2 can be recovered. Similarly, data A3" in device 4 is uncorrectable by ECC, but original data A3 is recovered from data A3* in device 2. Original data A3 is then transformed to provide data A3, which replaces uncorrectable data A3". The transformation of data A3 to A3 is performed by data scrambler DS", which is modified to perform a different transformation than was performed for previously stored data. In this example, data A2 and A3 are the result of a similar transformation. However, in other cases, different transformations may be used in different devices when performing replacement.

Figure 11A:
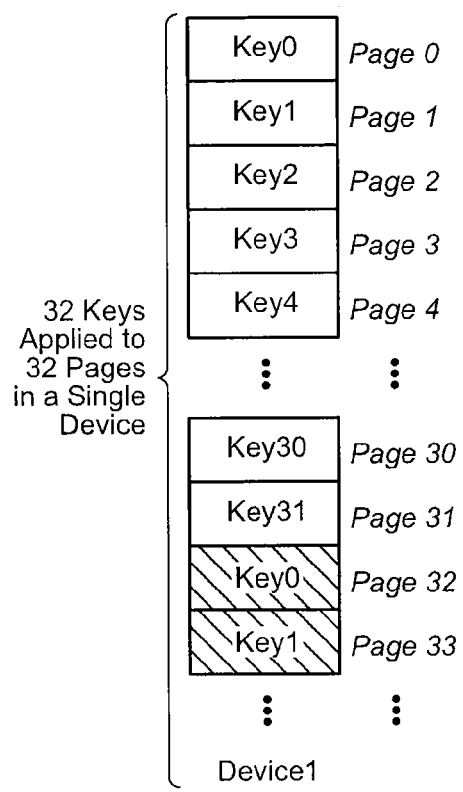
FIG. 11A shows a set of 32 keys used sequentially to transform 32 consecutive pages before the keys are repeated.
Figure 11B:
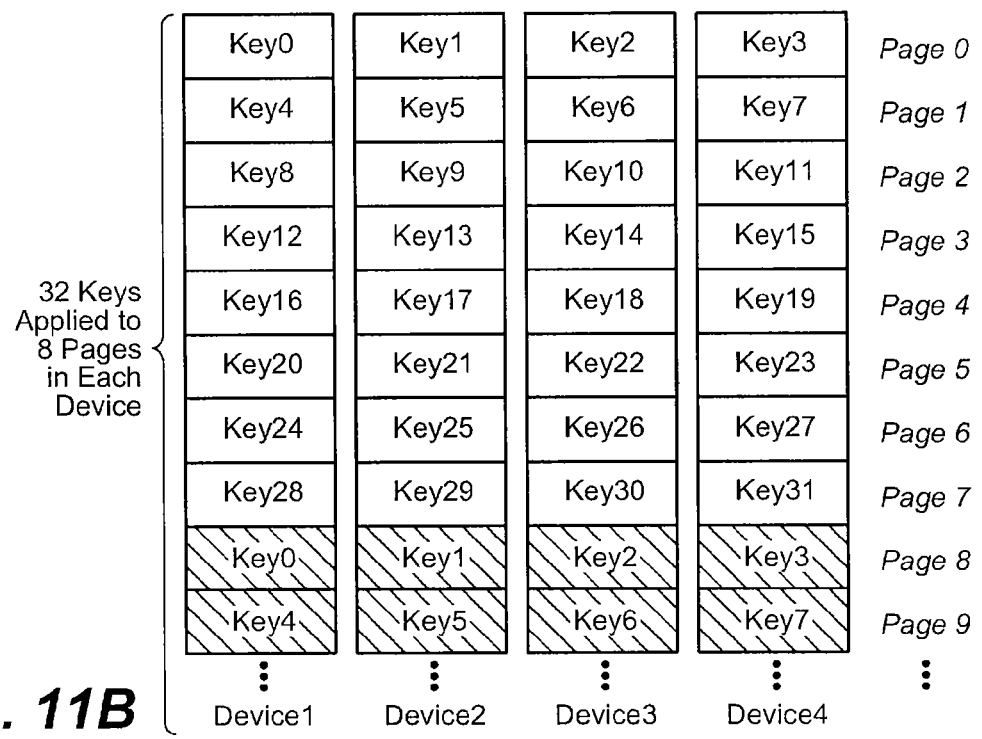
FIG. 11B shows 32 keys used to transform data that is striped across four devices, with keys repeating within each device after 8 pages.

In some memory systems, data transformation is performed according to a key. For example transformed data may be the product of an XOR operation on the original data and a key. To recover the original data, the operation is reversed. The key may be changed periodically (e.g. changed for each sector, each page, each block or some other pattern). Generally a limited number of keys are used, so that there is a repetitive pattern of key usage. However, where such a system is used with data striping, only a fraction of the total number of keys may be used in any one device resulting in the key pattern repeating sooner than expected. FIG. 11A shows device 1 in which 32 keys (key 0 to key 31) are used to scramble data within a memory system having four devices (device 1-device 4), the key changing from page to page. With 32 keys, the pattern of key use repeats after 32 pages. However, if this scheme is applied in a memory system using striping as shown in FIG. 11B, then the key repeats much sooner. In this case, after just 8 pages. It is generally undesirable for the pattern to repeat so soon because the risk of memory cells interacting is increased if the keys repeat sooner.

Figure 12A:
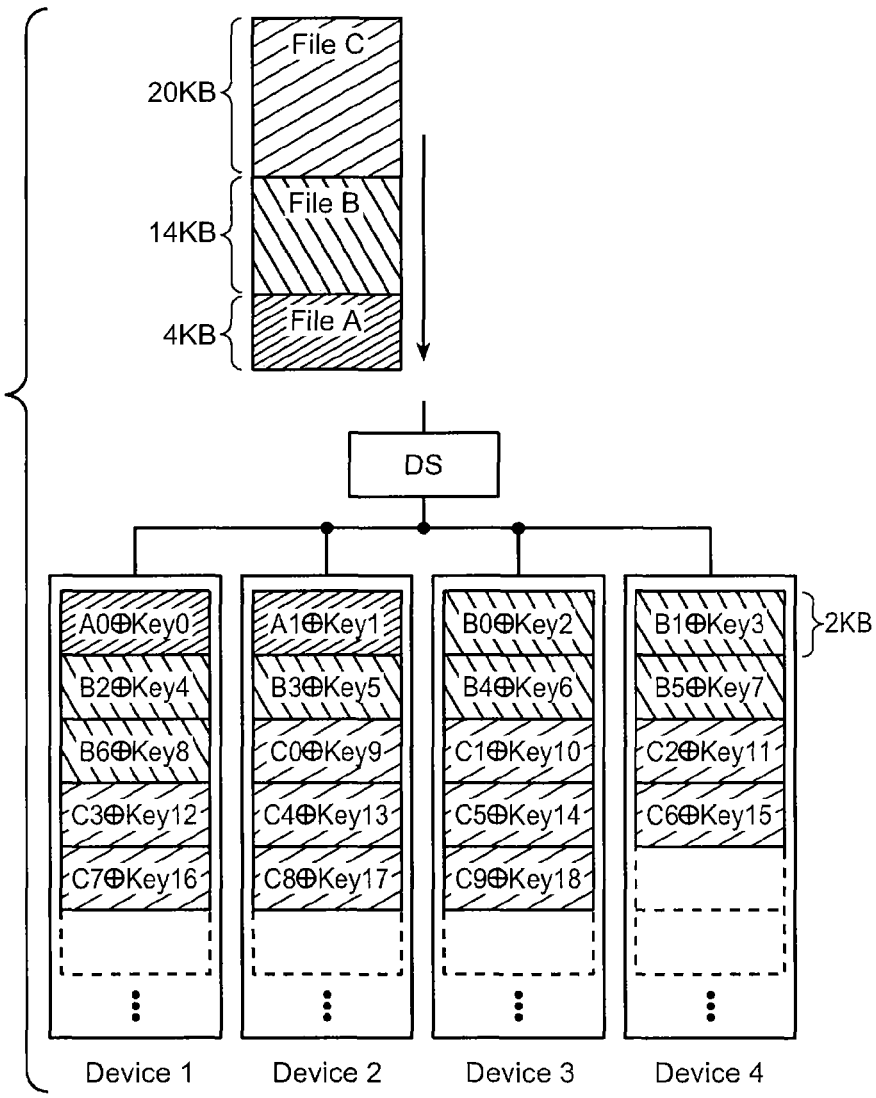
FIG. 12A shows data stored using a single data scrambler unit that transforms data using a set of keys that change for each page of data.

FIG. 12A shows another example where a single data scrambler DS uses a limited number of keys to scramble data before the data is striped across devices 1-4. As can be seen, the keys used in each device are limited to a particular subset of keys, and the keys repeat within a device sooner as a result.

Figure 12B:
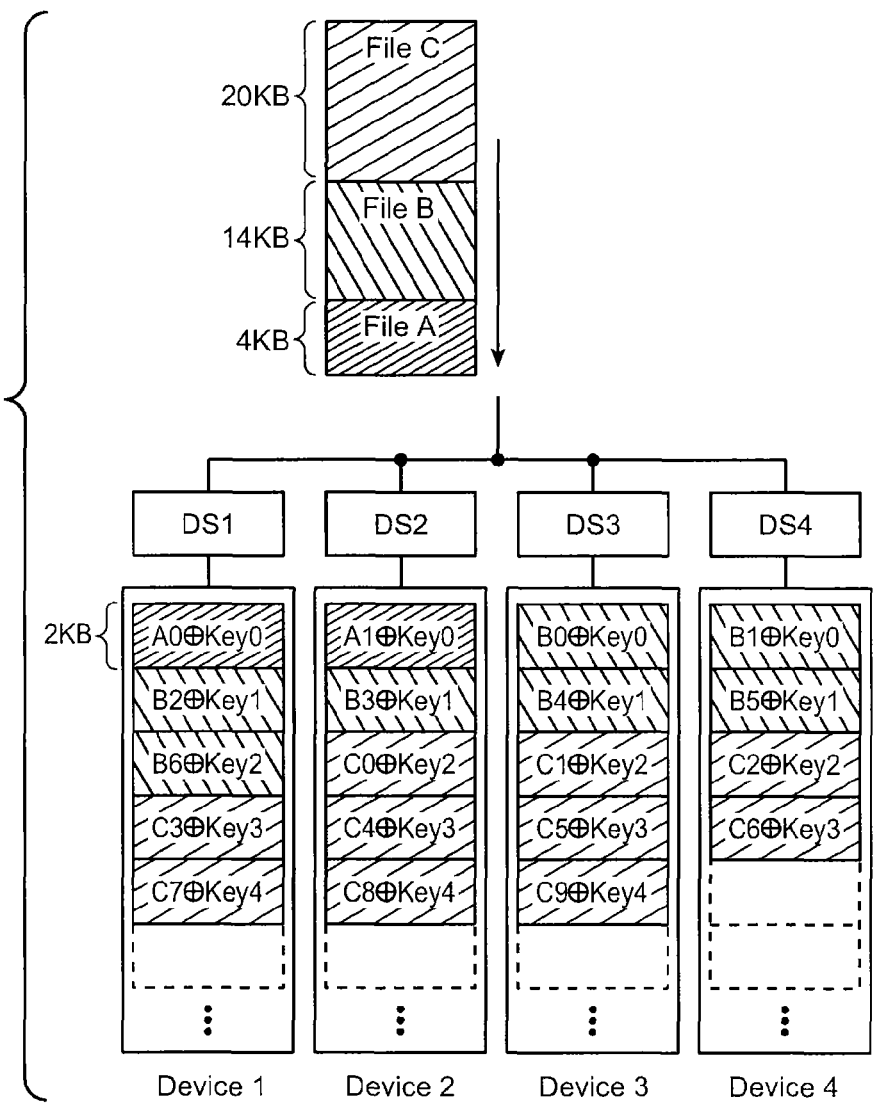
FIG. 12B shows an alternative system with separate data scrambler units for each device, with each data scrambler using keys sequentially so that keys are not frequently repeated within a device.

FIG. 12B shows an alternative configuration where a different data scrambler is used for each device, with each data scrambler using a full set of keys so that all keys are used in each device. This increases the interval between reuse of the same key and so lowers the chances of memory cell states aligning in a manner that would result in data corruption. Thus, even where no redundancy is provided, using different scrambling for each device may be advantageous. FIG. 12B shows the same pattern of key use by each data scrambler. In other examples, different data scramblers may use keys in different orders. For example, each data scrambler may start with a different key (e.g. data scrambler DS1 may start with key 0, data scrambler DS2 may start with key 8, data scrambler DS3 may start with key 16, and DS4 may start with key 24). Each scrambler may have an initial key, or seed, from which subsequent keys are derived. One way to ensure different transformations for data in different devices is to initialize their respective data scramblers using different seeds. In other examples, data scramblers may be controlled so that different keys are used by each data scrambler when scrambling the same data.

Figure 13:
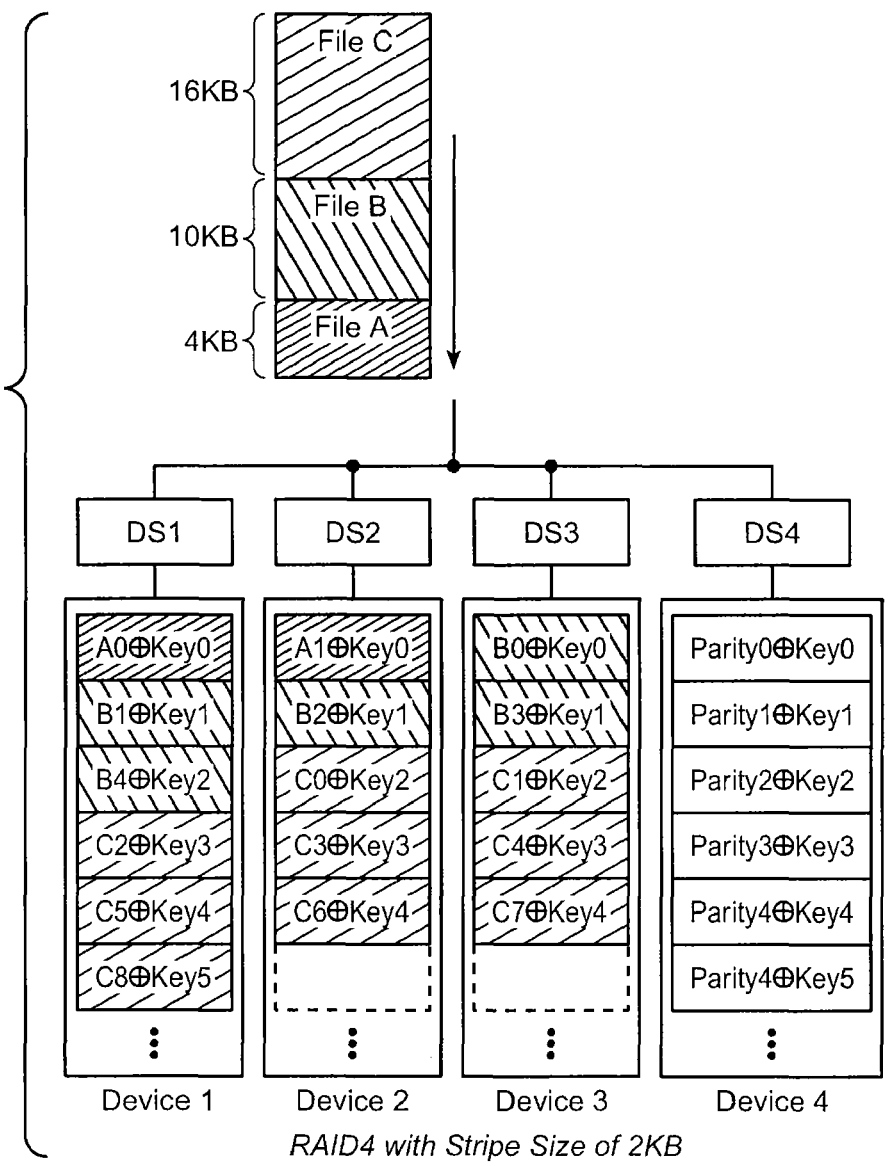
FIG. 13 shows a memory system that uses a dedicated device to store parity data, and which has dedicated data scrambler units for each device.

FIG. 13 shows an example of maintaining parity data in a dedicated device (RAID 4). In this case, parity data is stored exclusively in device 4. Parity data in device 4 is derived from data stored in devices 1-3. Parity data may be derived before or after data is scrambled. Parity information adds an extra level of protection against failure by allowing data in one device to be reconstructed from data in other devices including parity data. Generally, using parity data increases redundancy but also incurs a performance penalty because of the time to perform parity operations whenever data is written or read. Each device has a dedicated data scrambler, so that data scrambling keys are not frequently repeated within a device.

Figure 14:
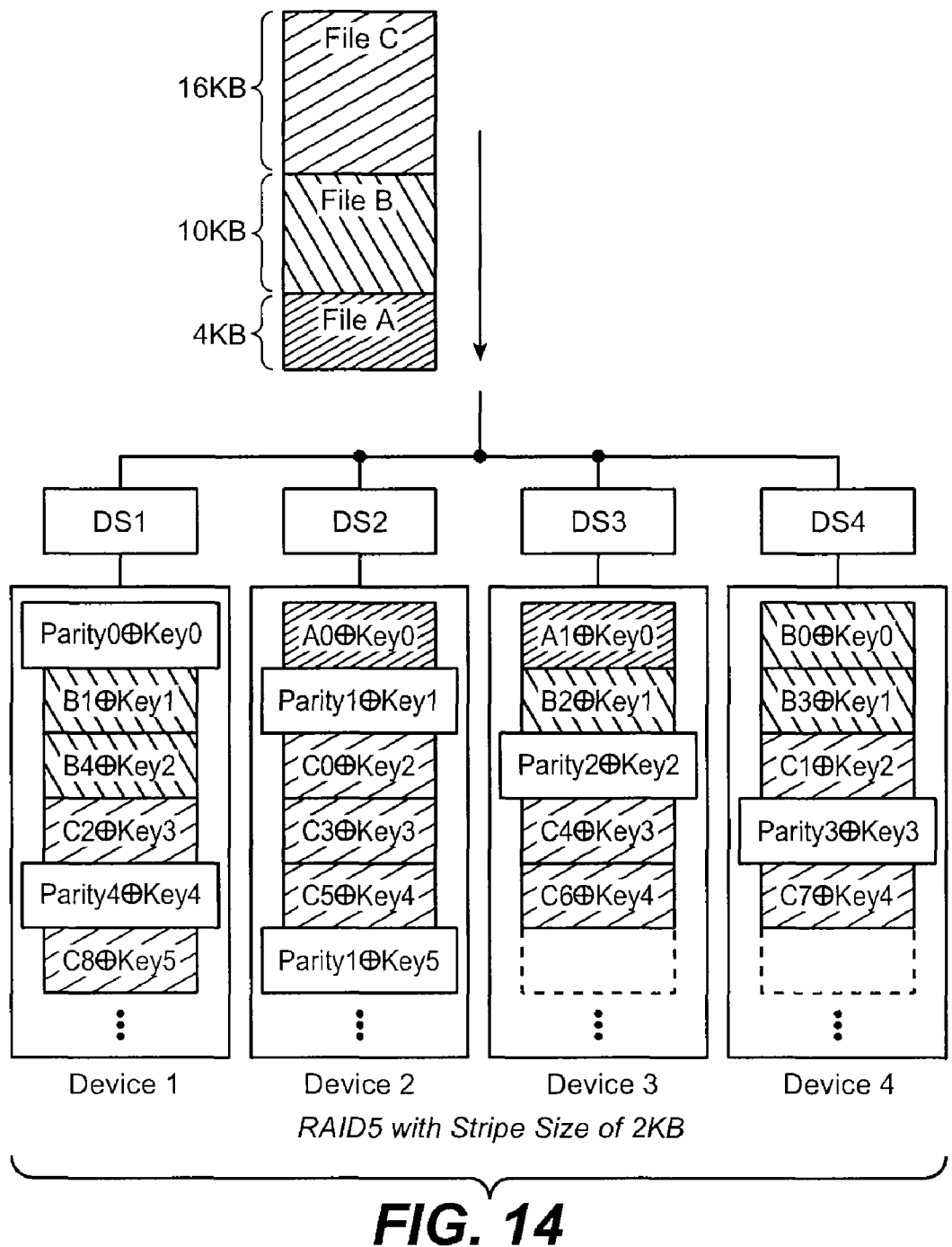
FIG. 14 shows a memory system in which parity data is distributed across four devices, with each device having a dedicated data scrambler unit.

FIG. 14 shows an example where parity data is distributed across all devices (RAID 5). In this example, each stripe includes parity data derived from the other data in the stripe. For example, Parity0 is derived from A0, A1 and B0. Parity1 is derived from B1, B2 and B3. This example also shows dedicated data scramblers for each device.

Certain examples show a dedicated data scrambler unit attached to an individual device. This may be achieved through hardware by having a dedicated circuit (e.g. a peripheral circuit on a memory die). In other examples, data scrambling may be achieved by firmware in a controller so that the same hardware is used for different circuits, but the firmware ensures that different transformations are performed according to the destination device. Other hardware may also provide different scrambling to more than one device at a time. Thus, different scrambling schemes may be achieved without necessarily requiring different hardware for each device.

Various schemes described above may be combined with, or used to replace, other schemes that provide high reliability. For example, the schemes are generally combined with an ECC scheme that provides protection against failure due to a small number of errors in a portion of data. In general, the schemes described above are performed within a memory system (e.g. a removable memory card or USB flash drive) and may not be visible to a host. In some cases, the degree of protection, or a particular protection scheme, may be selected by a user, through the host, or otherwise. In some cases, the host system may have its own protection scheme that is in addition to any protection scheme in the memory system.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain preferred embodiments, it is understood that the invention is entitled to protection within the full scope of the appended claims.

What is claimed is:

1. A method of securely storing data in a nonvolatile memory array comprising:

transforming a portion of data according to a first transformation to obtain first transformed data;

storing the first transformed data in a first portion of the memory array;

transforming the portion of data according to a second transformation to obtain second transformed data;

storing the second transformed data in a second portion of the memory array while the first transformed data is stored in the first portion of the memory array, to provide redundant storage of the portion of data;

subsequently, in response to attempting to read the first transformed data from the first portion of the memory array and determining that the first transformed data is uncorrectable by error correction code, reading the second transformed data from the second portion of the memory array and using the second transformed data to recover the portion of data and subsequently transforming the portion of data according to a third transformation to obtain third transformed data, storing the third transformed data in a third portion of the memory array and erasing the stored first transformed data.

2. The method of claim 1 wherein the first transformation scrambles data based on a first seed and the second transformation scrambles data based on a second seed.

3. The method of claim 1 wherein transforming the portion of data according to the first transformation is performed in parallel with transforming the portion of data according to the second transformation.

4. The method of claim 1 wherein the first portion of the memory array is a first block and the second portion of the memory array is a second block.

5. The method of claim 1 wherein the first portion of the memory array is a first plane and the second portion of the memory array is a second plane.

6. The method of claim 1 wherein the first portion of the memory array is a first die and the second portion of the memory array is a second die.

7. A nonvolatile memory system comprising:

a memory array;

a memory controller configured to perform the following operations:

transforming a portion of data according to a first transformation to obtain first transformed data storing the first transformed data in a first portion of the memory array;

transforming the portion of data according to a second transformation to obtain second transformed data;

storing the second transformed data in a second portion of the memory array while the first transformed data is stored in the first portion of the memory array, to provide redundant storage of the portion of data subsequently, in response to attempting to read the first transformed data from the first portion of the memory array and determining that the first transformed data is uncorrectable by error correction code, reading the second transformed data from the second portion of the memory array and using the second transformed data to recover the portion of data and subsequently transforming the portion of data according to a third transformation to obtain third transformed data, storing the third transformed data in a third portion of the memory array and erasing the stored first transformed data.

8. The nonvolatile memory system of claim 7 wherein the memory controller further comprises a first scrambler unit that contains a first exclusive OR (XOR) circuit to perform XOR operations using a first number and a second scrambler that contains a second XOR circuit to perform XOR operations using a second number.

9. The nonvolatile memory system of claim 8 wherein the first scrambler unit and the second scrambler unit scramble the same data in parallel.

10. The nonvolatile memory system of claim 7 wherein the first memory array portion is a first block and the second memory array portion is a second block.

11. The nonvolatile memory system of claim 7 wherein the first memory array portion is a first plane and the second memory array portion is a second plane.

12. The nonvolatile memory system of claim 7 wherein the first memory array portion is a first die and the second memory array portion is a second die.

13. The nonvolatile memory system of claim 7 wherein the memory system is in a removable memory card.

14. The nonvolatile memory system of claim 7 where the first and second transformations are reversible transformations.

* * * * *